United States Patent [19]

Harkness et al.

[11] Patent Number: 6,051,625

[45] Date of Patent: Apr. 18, 2000

[54] ULTRAVIOLET-CURABLE POLYSILOXANE COMPOSITION AND METHOD FOR THE FORMATION OF CURED PATTERNS THEREFROM

[75] Inventors: Brian R. Harkness, Vale of Glamorgan, United Kingdom; Mamoru Tachikawa; Kasumi Takei, both of Kanagawa, Japan

[73] Assignee: Dow Corning Asia, LTD., Tokyo, Japan

[21] Appl. No.: 08/881,168

[22] Filed: Jun. 24, 1997

[30] Foreign Application Priority Data

Jun. 27, 1996 [JP] Japan ................................. 8-167488

[51] Int. Cl.$^7$ ....................................................... C08F 2/46
[52] U.S. Cl. ................................. 522/99; 528/32; 528/33; 528/43
[58] Field of Search ................................. 522/99; 528/32, 528/33, 43

[56] References Cited

U.S. PATENT DOCUMENTS

| | | | |
|---|---|---|---|
| 4,693,960 | 9/1987 | Babich et al. | 430/323 |
| 4,702,990 | 10/1987 | Tanaka et al. | 430/197 |

FOREIGN PATENT DOCUMENTS

| | | |
|---|---|---|
| 0 164 598 | 12/1985 | European Pat. Off. . |
| 0 199 940 | 3/1986 | European Pat. Off. . |
| 12 57 435 | 8/1961 | Germany . |
| 6-080879 | 6/1994 | Japan . |

OTHER PUBLICATIONS

Ivanoua et al., US P. Gazou. Khromatogr, (1975), 4, p. 51, pp. 211–216.

*Primary Examiner*—Robert Dawson
*Assistant Examiner*—D. Aylward
*Attorney, Agent, or Firm*—Sharon K. Severance; Roger E. Gobrogge

[57] ABSTRACT

The instant invention pertains to a curable composition comprising
(a) substance that generates free radicals under the action of ultraviolet radiation and
(b) polymer molecule bearing functionality capable of polymerization under the action of said free radicals wherein (a) is a benzoin ether and makes up from 0.001 to 10 wt % of the total composition and (b) has the following formula $$(R_3SiO_{1/2})_a(R'_2SiO_{2/2})_b(R''SiO_{3/2})_c(SiO_{4/2})_d$$

in which R, R', and R" are each H or $C_1$ to $C_{10}$ hydrocarbyl possibly containing a heteroatom and at least 10% is, for example, a vinyl group, and a+b+c+d=1. The composition of the instant invention is a storage-stable UV-curable composition that does not suffer from cure inhibition by air or oxygen, that is very efficiently cured by low doses of UV radiation, and provides a highly heat-resistant cured pattern by heating after pattern formation.

5 Claims, No Drawings

ULTRAVIOLET-CURABLE POLYSILOXANE COMPOSITION AND METHOD FOR THE FORMATION OF CURED PATTERNS THEREFROM

BACKGROUND OF THE INVENTION

This invention relates to an ultraviolet-curing silicon-containing resin composition that can be used to fabricate dielectric films in semiconductor devices, and to a method for forming cured silicone patterns using said composition.

Silicone resins are widely used as electrical and electronic materials due to their generally high heat resistance and excellent electrical characteristics. Among these, curable silicone resins are used to coat substrate surfaces. The heat-curing types in general cure through the hydrosilylation reaction, silanol condensation reaction, or siloxane bond-forming reactions based on alcohol, oxime, or acetic acid elimination. UV-curable silicone resins become important when considering factors such as the heat tolerance of the substrate, cure rate, or selective curability.

Cured regions in which crosslinking has been induced by the above-described methods as a general rule have a substantially lower solvent solubility than the uncured regions, and the exploitation of this feature makes imaging possible.

Vinyl- and mercapto-functional silicone can be cured by UV in the presence of oxygen. The technology using the addition of mercaptan to olefin suffers from the odor and corrosivity due to the mercaptan. Air (oxygen) induces cure inhibition where the curing technologies employ the radical polymerization of functional groups as acryloyl, methacryloyl, and so forth. Moreover, the resulting crosslinking moiety has a low thermal stability, and thus the cured products are not robust to use and processing at high temperatures.

The epoxy-functional silicones and vinyl ether-functional silicones are generally cured using a substance that generates acid upon photoexposure. This acid facilitates substrate corrosion while the electrical properties of the cured products are impaired by the ionic impurity.

Silanol-functional silicones and Si-H-functional silicones can be cured through the use of a substance that generates base upon photoexposure, and the resulting cured products thus contain a base. This base also causes various problems, such as impairing the electrical properties of the cured product and causing long-term changes in mechanical properties due to siloxane bond rearrangement. The silanol-functional silicones can also be cured using a substance that generates acid upon photoexposure (Japanese Patent Application Laid Open [Kokai or Unexamined] Number Hei 6-80879 [80,879/1994]). This technology, however, suffers from the same problems as described above for the epoxy-functional silicones and vinyl ether-functional silicones.

Thus, as described above various cure technologies are known for photocurable silicones, but in each case one encounters problems.

It is therefore an object of this invention to provide a storage-stable UV-curable composition whose cure is not inhibited by air or oxygen, which is very efficiently cured by low doses of UV radiation, and which provides a highly heat-resistant cured pattern through the execution of a post-patterning heat treatment.

It is further an object of this invention to provide a method for the formation of cured patterns using the UV-curable composition.

SUMMARY OF THE INVENTION

This invention is a curable composition comprising (a) 0.001 to 10 wt % based on the total weight of the curable composition of a benzoin ethers ("UV free radical generator") and (b) a free-radical polymerizable functional silicone polymer of the general formula

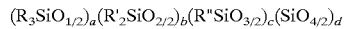

wherein R, R', and R" are independently selected from the group consisting of hydrogen and $C_1$ to $C_{10}$ saturated and unsaturated hydrocarbyl. The hydrocarbyl may contain one or more atoms selected from fluorine, oxygen, chlorine, and nitrogen. At least 10% of the total R, R', and R" is selected from vinylphenyl, vinylbenzyl, and vinylphenethyl. The sum of subscripts a, b, c, and d=1. The subscripts are each 0 or a positive number and fall into the following ranges:

$0.8 \geq a \geq 0$ $0.5 \geq b \geq 0$ $1.0 \geq c \geq 0$ $0.65 \geq d \geq 0$.

At least one of the silicon-bonded divalent oxygen atoms in each $R'_2SiO_{2/2}$, each $R''SiO_{3/2}$, and each $SiO_{4/2}$ is bonded to another silicon to form a siloxane bond while the remaining oxygen in each case can be bonded to another silicon to form a siloxane bond, or can be bonded to methyl or ethyl to form an alkoxy group, or can be bonded to hydrogen to form silanol.

Exposure of this composition to ultraviolet light at particular wavelengths results in an initial cure of the composition in the exposed regions. This process may be carried out in air or under an inert gas blanket such as nitrogen, argon, or others.

THE INVENTION

This invention is a curable composition comprising (a) 0.001 to 10 wt % based on the total weight of the curable composition of a benzoin ethers ("UV free radical generator") and (b) a free-radical polymerizable functional silicone polymer of the general formula

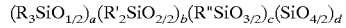

wherein R, R', and R" are independently selected from the group consisting of hydrogen and $C_1$ to $C_{10}$ saturated and unsaturated hydrocarbyl wherein the hydrocarbyl may contain one or more atoms selected from fluorine, oxygen, chlorine, and nitrogen; with the proviso that at least 10% of the total R, R', and R" is selected from vinylphenyl, vinylbenzyl, and vinylphenethyl; $0.8 \geq a \geq 0$; $0.5 \geq b \geq 0$; $1.0 \geq c \geq 0$; $0.65 \geq d \geq 0$; and the sum of subscripts a, b, c, and d=1.

The UV free radical generator is a benzoin ethers and is contained at from 0.001 to 10 wt % based on the total weight of the curable composition. The free radicals produced by irradiating the composition function as initiators of the polymerization reaction, and the free radical generator can therefore be added in a catalytic quantity relative to the polymerizable functionality in the subject composition. The addition of too much can lead to fragile physical properties on the part of the composition prior to its cure and can adversely affect the physical properties of the cured composition. Taking into account the cure rate as well as the physical properties of the subject curable composition and the cured product therefrom, the free radical generator is preferably present from 0.01 to 5% based on the total weight of the curable composition.

The free radical generator may exemplified by the 2,2-dialkoxy-1,2-diphenylethan-1-ones with general formula (2) below and by the 2-alkoxy-1,2-diphenylethan-1-ones with general formula (3) below wherein R is independently selected from methyl, ethyl, and propyl.

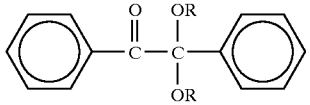

(2)

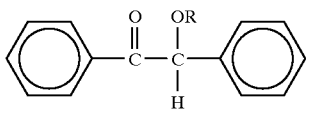

(3)

When considering factors such as ease of acquisition and handling, good photodegradability, and high catalytic activity by the generated free radicals, Irgacure 651™ is optimal among the free radical generators described above. This particular compound is preferably added at from 0.01 to 5 wt % of the composition.

The free radical-polymerizable functional silicone polymer in the curable composition is defined by the following general formula.

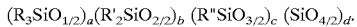

The R, R', and R" in this formula are independently selected from hydrogen and $C_1$ to $C_{10}$ saturated and unsaturated hydrocarbyl. The hydrocarbyl may contain one or more atoms selected from fluorine, oxygen, chlorine, and nitrogen. At least 10% of the total R, R', and R" is selected from vinylphenyl, vinylbenzyl, and vinylphenethyl. Subscripts a, b, c, and d in the general formula sum to 1. Subscripts a, b, c, and d are each 0 or a positive number and fall into the following ranges:

$0.8 \geq a \geq 0$ $0.5 \geq b \geq 0$ $1.0 \geq c \geq 0$ $0.65 \geq d \geq 0$.

At least one of the silicon-bonded divalent oxygen atoms in each $R'_2SiO_{2/2}$, at least one of the silicon-bonded divalent oxygen atoms in each $R''SiO_{3/2}$, and at least one of the silicon-bonded divalent oxygen atoms in each $SiO_{4/2}$ is bonded to another silicon to form a siloxane bond while the remaining oxygen in each case can be bonded to another silicon to form a siloxane bond, or can be bonded to methyl or ethyl to form an alkoxy group, or can be bonded to hydrogen to form silanol.

The $R_3Si$ in the $R_3SiO_{1/2}$ may be exemplified by trimethylsilyl, dimethylsilyl, phenyldimethylsilyl, vinyldimethylsilyl, trifluoropropyldimethylsilyl, (4-vinylphenyl)dimethylsilyl, (vinylbenzyl)dimethylsilyl, and (vinylphenethyl)dimethylsilyl.

The $R'_2Si$ in the $R'_2SiO_{2/2}$ may be exemplified by dimethylsilylene, phenylmethylsilylene, diphenylsilylene, (vinylphenyl)hydrogensilylene, (vinylbenzyl)hydrogensilylene, (vinylphenethyl)hydrogensilylene, (vinylphenyl)methylsilylene, (vinylbenzyl)methylsilylene, (vinylphenethyl)methylsilylene, (vinylphenyl)phenylsilylene, (vinylbenzyl)phenylsilylene, and (vinylphenethyl)phenylsilylene.

The R" in the $R''SiO_{3/2}$ may be exemplified by hydrogen, methyl, ethyl, propyl, butyl, hexyl, cyclohexyl, octyl, trifluoropropyl, phenyl, para-tolyl, meta-tolyl, phenethyl, vinylphenyl, vinylbenzyl, and vinylphenethyl.

The following are examples of the free radical-polymerizable functional silicone polymer that contains vinylphenyl in the form of $R''SiO_{3/2}$: hydrolyzates of (vinylphenyl)trichlorosilane; resins synthesized by cohydrolysis of methyltrichlorosilane and (vinylphenyl)trichlorosilane; resins synthesized by cohydrolysis of dimethyldichlorosilane, phenyltrichlorosilane, and (vinylphenyl)trichlorosilane; resins synthesized by cohydrolysis of dimethyldichlorosilane and (vinylphenyl)trichlorosilane; resins synthesized by cohydrolysis of diphenyldichlorosilane and (vinylphenyl)trichlorosilane; and resins synthesized by condensation and hydrolysis of diphenylsilanediol and (vinylphenyl)trichlorosilane.

The following are examples in which vinylbenzyl is present in the form of $R''SiO_{3/2}$: hydrolyzates of (vinylbenzyl)trichlorosilane; resins synthesized by cohydrolysis of methyltrichlorosilane and (vinylbenzyl)trichlorosilane; resins synthesized by cohydrolysis of dimethyldichlorosilane, phenyltrichlorosilane, and (vinylbenzyl)trichlorosilane; resins synthesized by cohydrolysis of dimethyldichlorosilane and (vinylbenzyl)trichlorosilane; resins synthesized by cohydrolysis of diphenyldichlorosilane and (vinylbenzyl)trichlorosilane; and resins synthesized by condensation and hydrolysis of diphenylsilanediol and (vinylbenzyl)trichlorosilane.

The following are examples in which vinylphenethyl is present in the form of $R''SiO_{3/2}$: hydrolyzates of (vinylphenethyl)trichlorosilane; resins synthesized by cohydrolysis of methyltrichlorosilane and (vinylphenethyl)trichlorosilane; resins synthesized by cohydrolysis of dimethyldichlorosilane, phenyltrichlorosilane, and (vinylphenethyl)trichlorosilane; resins synthesized by cohydrolysis of dimethyldichlorosilane and (vinylphenethyl)trichlorosilane; resins synthesized by cohydrolysis of diphenyldichlorosilane and (vinylphenethyl)trichlorosilane; and resins synthesized by condensation and hydrolysis of diphenylsilanediol and (vinylphenethyl)trichlorosilane.

The following are examples of free radical-polymerizable functional silicone polymers that contains vinylphenyl in the form of $R'_2SiO_{2/2}$: resins synthesized by cohydrolysis of methyltrichlorosilane and (vinylphenyl)methyldichlorosilane; resins synthesized by cohydrolysis of trichlorosilane and (vinylphenyl)methyldichlorosilane; resins synthesized by cohydrolysis of phenyltrichlorosilane and (vinylphenyl)methyldichlorosilane; resins synthesized by cohydrolysis of (vinylphenyl)methyldichlorosilane and (vinylphenyl)trichlorosilane; resins synthesized by cohydrolysis of methyltrichlorosilane and (vinylphenyl)phenyldichlorosilane; resins synthesized by cohydrolysis of trichlorosilane and (vinylphenyl)phenyldichlorosilane; and resins synthesized by cohydrolysis of phenyltrichlorosilane and (vinylphenyl)phenyldichlorosilane.

Polymers containing vinylbenzyl or vinylphenethyl in the form of $R'_2SiO_{2/2}$ can be similarly prepared, but using a dichlorosilane containing vinylbenzyl or vinylphenethyl instead of vinylphenyl.

A polymer molecule having vinylphenyl, vinylbenzyl, or vinylphenethyl as at least one R in $R_3SiO_{1/2}$ can be synthesized, for example, by the hydrolysis of trimethylchlorosilane, silicon tetrachloride, and a selection from vinylphenyldimethylchlorosilane, vinylbenzyldimethylchlorosilane, and vinylphenethyldimethylchlorosilane; by the hydrolysis of hexamethyldisiloxane, silicon tetrachloride, and a selection from vinylphenyldimethylchlorosilane, vinylbenzyldimethylchlorosilane, and vinylphenethyldimethylchlorosilane; and by the hydrolysis of hexamethyldisiloxane, methyl orthosilicate or ethyl orthosilicate, and a selection from vinylphenyldimethylchlorosilane, vinylbenzyldimethylchlorosilane, and vinylphenethyldimethylchlorosilane.

The UV curable composition may optionally contain (c) a base generator that generates a basic compound under the effect of heating ("thermal base generator") The thermal base generator may be selected from organic amide compounds that contain the moiety with general formula (1) and is present at from 0.01 to 10% based on the total weight of the UV curable composition.

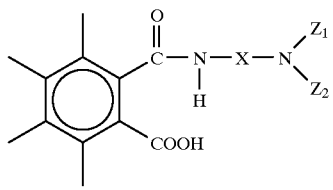

(1)

The thermal base generator may be exemplified by o-{(β-(dimethylamino)ethyl)aminocarbonyl}benzoic acid, o-{(γ-(dimethylamino)propyl)aminocarbonyl}benzoic acid, 2,5-bis{(β-(dimethylamino)ethyl)aminocarbonyl}terephthalic acid, 2,5-bis{(γ-(dimethylamino)propyl)aminocarbonyl}terephthalic acid, 2,4-bis{(β-(dimethylamino)ethyl)aminocarbonyl}isophthalic acid, and 2,4-bis{(γ-(dimethylamino)propyl)aminocarbonyl}isophthalic acid.

When the free radical-polymerizable functional silicone polymer contains silanol or alkoxy bonded to silicon, the basic compound generated from (c) accelerates siloxane bond formation by functioning as a catalyst of siloxane bond-forming reactions whose by-product is, respectively, water or alcohol.

This invention also pertains to a method for forming cured silicone in a negative pattern of a photomask. This method comprises forming a latent image in a coating of the curable composition by placing a masking pattern (mask) between the UV source and a thin film of the UV curable composition; effecting exposure; treating as necessary for up to ten minutes at from 20° C. to 180° C.; washing with an inorganic or organic solvent in order to dissolve and remove (develop) the uncured curable composition thereby forming a negatively patterned cured product. This is followed by an additional heating for 1 minute to 10 hours at from 50° C. to 400° C. in order to accelerate the curing reactions in the silicone resin.

A sensitizer can optionally be added to the UV curable composition. N-phenylglycine, N-phenyldiethanolamine, azidoanthraquinone, 3,3'-carbonyl(diethylaminocoumarin), and the like are useful herein. The sensitizer is typically present from 0.1 wt % to 5 wt %.

Insofar as the essential features of the present invention are not compromised, the UV-curable composition may contain a third component. In particular, a component can be added that functions as a catalyst of crosslinking reactions within the resin during heating. Such a component is added for the purpose of additionally accelerating thermal curing reactions in the residual negative regions after patterning by development. Components of this type are exemplified by radical initiators that accelerate cure through radical reactions, e.g., peroxides, azo compounds, and others, and by transition metal catalysts that at elevated temperature manifest catalytic activity in the hydrosilylation reaction.

The composition may also contain a catalytic quantity of a photobase generator that decomposes under exposure to UV radiation with the production of a basic compound. By generating a basic compound in the irradiated regions during UV exposure, this additive also functions to accelerate siloxane bond-forming reactions during the post-bake that follows development (Japanese Patent Application Laid Open [Kokai or Unexamined] Numbers Hei 6-148887 and 6-273936).

In addition to the preceding, organic and inorganic components having special functionalities or physical properties can be dissolved or dispersed in the curable composition for the purpose of thereby producing a cured pattern endowed with the particular desired functionalities or physical properties.

As the preceding explanation has made clear, upon exposure to UV radiation having a specific wavelength component this composition will cure only in the exposed regions. This technology, is capable of reproducing the fine patterns on a mask. Moreover, post-curing reactions can convert the resulting pattern into a cured silicone film that exhibits excellent insulating properties, an excellent heat resistance, and an excellent resistance to oxygen plasmas.

So that those skilled in the art can understand and appreciate the invention taught herein, the following examples are presented, it being understood that these examples should not be used to limit the scope of this invention found in the claims.

In the product characterization data in the following examples, $^{29}Si\{1H\}$-NMR refers to $^{29}Si$ nuclear magnetic resonance spectroscopy (proton decoupled); $CDCl_3$ refers to deuterochloroform; the functional group within parentheses in the nuclear magnetic resonance spectral data refers to the assignment for the particular signal; and the chemical shift in the $^{29}Si$-NMR spectra is the value obtained using 0 ppm for the chemical shift of the silicon in a tetramethylsilane external standard ($CDCl_3$ solution). The UV exposure experiments were run using a UIS-500C Lamphouse from Ushio Denki Kabushiki Kaisha (500-W mercury-xenon lamp) and a "Kin'itsu-kun" uniform UV irradiator (200-W mercury-xenon lamp) from Yamashita Denso Kabushiki Kaisha. GPC refers to gel permeation chromatography.

PREPARATION EXAMPLE 1

Synthesis of thermal base generator

A tetrahydrofuran solution (5 g/25 mL) of ortho-phthalic anhydride was placed in a 100-mL flask that had been filled with nitrogen. To this was slowly added 3.0 g N,N-dimethylethylenediamine. The reaction was exothermic and produced a precipitate. The precipitate was recovered by filtration, washed twice with 10 mL tetrahydrofuran, and dried in a vacuum to give o-{(β-(dimethylamino)ethyl)aminocarbonyl}benzoic acid (quantitative). The product was confirmed by NMR spectroscopy.

PREPARATION EXAMPLE 2

Synthesis of poly(phenylsilsesquioxane-(4-vinylphenyl)silsesquioxane) resin 13.36 g phenyltrichlorosilane, 15.0 g (4-vinylphenyl)trichlorosilane, and 80 mL dioxane were placed in a 300-mL flask that had been filled with nitrogen. While cooling with a water bath, 6.8 g water dissolved in 40 mL dioxane was added over 30 minutes. The reaction was warmed to room temperature while stirring and was stirred for an additional 1 hour. After the addition of 10 mg phenothiazine, the organic solvent was distilled off using a rotary evaporator. 100 mL toluene was added to the residue, and the resulting organic solution was washed with water 4 times. The organic layer was dried over sodium sulfate. Filtration and distillation of the volatiles gave 16.2 g of a white solid.

GPC molecular weight (weight average, polystyrene calibration): 530.

Infrared absorption: 3613 cm$^{-1}$ (Si—OH), 3568 cm$^{-1}$ (Si—OH), 3375 cm$^{-1}$ (Si—OH), 1602 cm$^{-1}$, 1430 cm$^{-1}$, 1393 cm$^{-1}$.

$^1$H-NMR (chloroform-d): d:3.8–4.4 (0.26H), 5.6 (vinyl, 1H), 5.9 (vinyl, 1H), 6.9 (vinyl, 1H), 7.1–8.3 (phenyl, 9.78H). These results indicated phenyl:vinylphenyl= 1.16:1.0.

PREPARATION EXAMPLE 3

Synthesis of vinylphenylsilsesquioxane-diphenylsiloxane resin 20.5 g (4-vinylphenyl)trichlorosilane was placed in a 300-mL flask that had been filled with nitrogen. While stirring vigorously, 15.0 g diphenylsilanediol dissolved in 11.3 mL pyridine was added over 30 minutes. After stirring at room temperature for 30 minutes, 100 mL toluene was added. After additional stirring 50 mL water was added to the slurry followed by vigorous stirring for 10 minutes. The organic layer was separated and washed with water 4 times. The organic layer was then isolated, filtered, dried over sodium sulfate, and filtered again. Distillation of the solvent then gave 26 g of a high-viscosity oil.

GPC molecular weight (polystyrene calibration): weight-average molecular weight=790, number-average molecular weight=280.

Infrared absorption: 3613 cm$^{-1}$ (Si—OH), 3385 cm$^{-1}$ (Si—OH), 1601 cm$^{-1}$, 1429 cm$^{-1}$, 1393 cm$^{-1}$.

$^1$H-NMR (chloroform-d): d:2.7–4.0 (0.82H), 5.0–5.3 (vinyl, 1H), 5.3–5.9 (vinyl, 1H), 6.3–6.6 (vinyl, 1H), 6.6–7.8 (phenyl, 12.1H).

These results indicated Ph$_2$SiO:ViPhSi=0.81:1.0.

PREPARATION EXAMPLE 4

Synthesis of (vinylphenyl)dimethylsiloxane-silicate resin

The following were introduced into a 100-mL three-neck flask that had been filled with nitrogen: 18.3 g (4-vinylphenyl)dimethylchlorosilane, 3.5 g ethanol, and 24.5 g ethyl orthosilicate. 5.96 g water was added over 1 hour while stirring. A high viscosity oil separated upon standing overnight. 100 mL toluene was added to this oil, and the resulting organic layer was washed 7 times with water. The organic layer was then isolated, dried over anhydrous sodium sulfate, and filtered. Distillation of the volatiles gave 23 g (vinylphenyl)dimethylsiloxane-silicate resin.

GPC molecular weight (polystyrene calibration): weight-average molecular weight=1250, number-average molecular weight=960.

Infrared absorption: 3412 cm$^{-1}$ (Si—OH), 1630 cm$^{-1}$, 1599 cm$^{-1}$, 1545 cm$^{-1}$, 1391 cm$^{-1}$, 1256 cm$^{-1}$, 1078 cm$^{-1}$, 829 cm$^{-1}$, 789 cm$^{-1}$.

$^1$H-NMR (chloroform-d): d:0.2–0.5 (methyl, 6.1H), 0.9–1.3 (methyl, 1.4H), 3.6–4.0 (methylene, 0.92H), 5.2–5.3 (vinyl, 1H), 5.6–5.8 (vinyl, 1H), 6.6–6.8 (vinyl, 1H), 7.2–7.7 (phenyl, 4.2H).

$^{29}$Si-NMR (chloroform-d): d:0–5 (M, 0.79), −90 to −97 (Q, 0.13), −97 to −105 (Q, 0.44), −105 to −113 (Q, 0.43).

These results indicated M : Q=0.79:1.0.

EXAMPLE 1

Photocure of poly(phenylsilsesquioxane(vinylphenyl)-silsesquioxane) resin

Sensitivity and Contrast

Irgacure 651™ was dissolved at 0.8 wt % on resin into a 20% MIBK solution of the resin synthesized in Preparation Example 2. This solution was spin coated (500 rpm, 5 seconds, 1500 rpm, 15 seconds) on a silicon wafer. This was followed by drying at ambient temperature and then pre-baking for 1 minute at 80° C. The resulting coating had a thickness of 1 micron. The wafer was divided into 8 sectors, which were exposed to 50 mJ/cm$^2$ to 4 J/cm$^2$ UV radiation (measured at 254 nm). After exposure had been completed, the test specimen was post-baked for 1 minute at 150° C. and then developed for 1 minute with MIBK. After the test specimen had been dried, the film thickness in each sector was measured. A characteristic curve was constructed for the relationship between exposure dose and remaining film thickness, and the sensitivity for a 50% remaining film thickness, D50 and the contrast γ were determined. D50 was 770 mJ/cm and γ was 2.6.

Patterning

Using the same resin composition a silicon wafer test specimen was fabricated by spin coating using the same conditions as given above. After the pre-bake, a photomask was overlaid and UV exposure was effected for 30 seconds using the uniform UV irradiator (200-W mercury-xenon lamp). After a post-bake for 2 minutes at 150° C., the silicon wafer was washed with toluene and dried. This resulted in a clear and distinct pattern in the resin that corresponded to a negative of the photomask. Absolutely no residual resin was observed in the unexposed regions, indicating that absolutely no cure had occurred in these regions. Microscopic observation of the line/space pattern showed that a resolution of 5 microns had been obtained. The silanol was reacted by additionally heating this silicon wafer for 5 minutes at 250° C., which reduced the infrared absorption originating with silanol (3650 cm$^{-1}$) to about one-fifth. The resin pattern remained unaltered.

EXAMPLE 2

Photopatterning of poly(vinylphenylsilsesquioxane-diphenylsiloxane)resin

Irgacure 651™ was added at 1.0 wt % on resin to the resin synthesized in Preparation Example 3. 2 wt % (on resin) of the thermal base generator synthesized in Preparation Example 1 was then added. The resulting mixture was dissolved in toluene to prepare the 20 wt % solution. This solution was filtered through a filter with a pore size of 0.45 micrometer and then spin coated (500 rpm, 5 seconds, 1500 rpm, 15 seconds) on a silicon wafer. Pre-baking for 1 minute at 80° C. yielded a coating with a thickness of 1 micron. A photomask was overlaid and UV exposure was carried out for 2 minutes using the 200-W mercury-xenon lamp. The silicon wafer was then post-baked at 150° C. for 2 minutes, washed with toluene, and dried, with the result that a resin pattern corresponding to a negative of the photomask was obtained. The unexposed regions were entirely free of residual resin, indicating that absolutely no cure had occurred in these regions. It was determined from microscopic observation of the line/space pattern that a resolution of 10 microns had been obtained. The silanol was reacted by additionally heating this silicon wafer for 5 minutes at 250° C., which reduced the infrared absorption originating with silanol to about one-tenth. The resin pattern remained unaltered.

EXAMPLE 3
Photocure of (vinylphenyl)dimethylsiloxane-silicate resin

Irgacure 651™ was added at 0.5 wt % on resin to the resin synthesized in Preparation Example 4. The resulting mixture was dissolved in toluene to prepare the 20 wt % solution. This solution was filtered through a filter with a pore size of 0.45 micrometer and then spin coated (500 rpm, 5 seconds, 1500 rpm, 15 seconds) on a silicon wafer. Pre-baking for 1 minute at 70° C. yielded a coating with a thickness of about 1 micron. A photomask was overlaid and UV exposure was carried out for 13 seconds using the 200-W mercury-xenon lamp. The silicon wafer was then post-baked at 110° C. for 2 minutes, washed with toluene, and dried, with the result that a resin pattern corresponding to a negative of the photomask was obtained. The unexposed regions were entirely free of residual resin, indicating that absolutely no cure had occurred in these regions. It was determined from microscopic observation of the line/space pattern that a resolution of 18 microns had been obtained.

COMPARATIVE EXAMPLE 1
Photocure of diphenylsiloxane-methylsilsesquioxane resin
Synthesis of diphenylsiloxane-methylsilsesquioxane resin 42.7 g methyltrichlorosilane was introduced into a 500-mL flask that had been filled with nitrogen and was cooled to 0° C. To this was added 46.4 g diphenylsilanediol dissolved in 37.4 g pyridine over 10 minutes with good stirring. The reaction was then warmed to room temperature while stirring and stirring was continued for another 1 hour. 93 mL toluene was added to the solution followed by the addition of 200 mL water with vigorous stirring and then stirring for an additional 30 minutes. 200 mL ether was added to the resulting reaction mass, and the organic layer was then washed several times with water. The addition of hexane, filtration, and removal of the solvent at room temperature gave 54.7 g resin.

Infrared absorption: 3000~3600 cm$^{-1}$ (SiOH), 1127 cm$^{-1}$ (Si—Ph), 1030 cm$^{-1}$, 1090 cm$^{-1}$ (Si—O).

$^{29}$Si-NMR (CDCl$_3$): –35~47 ppm (Ph$_2$SiO), –50~60 ppm (MeSiO(OH)), –60~70 ppm (MeSiO$_{3/2}$).

GPC (polystyrene calibration): Mw=2400.

Photocure of the Resin

Irgacure 651 (2,2-dimethoxy-1,2-diphenylethan-1-one) was added at 1.0 wt % on resin to the diphenylsiloxane-methylsilsesquioxane resin prepared above and the resulting mixture was dissolved in toluene to prepare the 20 wt % solution. This solution was filtered through a filter with a pore size of 0.45 micrometer and then spin coated (500 rpm, 5 seconds, 1500 rpm, 15 seconds) on a silicon wafer. Pre-baking for 1 minute at 80° C. yielded a coating with a thickness of about 1 micron. A photomask was overlaid and UV exposure was carried out for 2 minutes using the 200-W mercury-xenon lamp. After a post-bake at 150° C. for 2 minutes, washing the silicon wafer with toluene resulted in dissolution and removal of the resin, indicating that the resin had not undergone cure.

COMPARATIVE EXAMPLE 2
Photocure of poly (allylsilsesquioxane) resin

Poly(allylsilsesquioxane) resin was synthesized from allyltrichlorosilane using the method described in U.S. Pat. No. 4,826,943.

Infrared absorption: 3000~3600 cm$^{-1}$(SiOH), 1620 cm$^{-1}$ (allyl), 1380 cm$^{-1}$ (Si-allyl), 1030 cm$^{-1}$, 1090 cm$^{-1}$ (Si—O).

$^{29}$SI-NMR (relative intensity, functional group): –58~65 ppm (0.14, CH$_2$=CHCH$_2$SiO (OH)), –67~78 ppm (0.86, CH$_2$=CHCH$_2$SiO$_{3/2}$).

GPC (polystyrene calibration): Mn=2300, Mw=17000.

Photocure of the Resin

Irgacure 651 (2,2-dimethoxy-1,2-diphenylethan-1-one) was added at 1.0 wt % on resin to the poly (allylsilsesquioxane) resin prepared above and the resulting mixture was dissolved in toluene to prepare the 20 wt % solution. This solution was filtered through a filter with a pore size of 0.45 micrometer and then spin coated (500 rpm, 5 seconds, 1500 rpm, 15 seconds) on a silicon wafer. Pre-baking for 1 minute at 80° C. yielded a coating with a thickness of about 1 micron. A photomask was overlaid and UV exposure was carried out for 2 minutes using the 200-W mercury-xenon lamp. After a post-bake at 150° C. for 2 minutes, washing the silicon wafer with toluene resulted in dissolution and removal of the resin, indicating that the resin had not undergone cure.

What is claimed is:

1. A ultraviolet-curable composition comprising
   (a) 0.001 to 10 wt % based on the total weight of the composition of a benzoin ethers selected from the group consisting of PhC(=O)C(OR)$_2$Ph and PhC(=O)CH(OR)Ph wherein Ph denotes phenyl and R is selected from the group consisting of methyl, ethyl, and propyl; and
   (b) a free-radical polymerizable functional silicone polymer of the general formula $$(R_3SiO_{1/2})_a(R'_2SiO_{2/2})_b(R''SiO_{3/2})_c(SiO_{4/2})_d$$

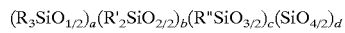

wherein R, R', and R" are independently selected from the group consisting of hydrogen, C$_1$ to C$_{10}$ saturated hydrocarbyl and C$_1$ to C$_{10}$ unsaturated hydrocarbyl, wherein the hydrocarbyl may contain one or more atoms selected from fluorine, oxygen, chlorine, and nitrogen; with the proviso that at least 10% of the total R, R', and R" is selected from the group consisting of vinylphenyl, vinylbenzyl, and vinylphenethyl; $0.8 \geq a \geq 0$; $0.5 \geq b \geq 0$; $1.0 \geq c \geq 0$; $0.65 \geq d \geq 0$; the sum of a, b, c, and d=1 and
   wherein at least one of the silicon-bonded divalent oxygen atoms in each R'$_2$SiO$_{2/2}$, each R"SiO$_{3/2}$, and each SiO$_{4/2}$ is bonded to another silicon to form a siloxane bond while the remaining oxygen in each case can be bonded to another silicon to form a siloxane bond, or can be bonded to methyl or ethyl to form an alkoxy group, or can be bonded to hydrogen to form silanol.

2. The composition as claimed in claim 1 wherein the benzoin ether is present from 0.01 to 5 wt % based on the total weight of the curable composition.

3. The composition as claimed in claim 1 wherein the free-radical polymerizable functional silicone polymer is a poly(phenylsilsesquioxane-(4-vinylphenyl) silsesquioxane) resin.

4. The composition as claimed in claim 1 wherein the free-radical polymerizable functional silicone polymer is a vinylphenylsilsesquioxane-diphenylsiloxane resin.

5. The composition as claimed in claim 1 wherein the free-radical polymerizable functional silicone polymer is a (vinylphenyl)dimethylsiloxane-silicate resin.

* * * * *